US012210295B2

(12) United States Patent
Hsu et al.

(10) Patent No.: US 12,210,295 B2
(45) Date of Patent: *Jan. 28, 2025

(54) RETICLE CLEANING DEVICE AND METHOD OF USE

(71) Applicant: Taiwan Semiconductor Manufacturing Company, Ltd., Hsinchu (TW)

(72) Inventors: Che-Chang Hsu, Taichung (TW); Sheng-Kang Yu, Hsinchu (TW); Shang-Chieh Chien, New Taipei (TW); Li-Jui Chen, Hsinchu (TW); Heng-Hsin Liu, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/308,700

(22) Filed: Apr. 28, 2023

(65) Prior Publication Data

US 2023/0266680 A1    Aug. 24, 2023

Related U.S. Application Data

(63) Continuation of application No. 17/655,877, filed on Mar. 22, 2022, now Pat. No. 11,650,512.

(Continued)

(51) Int. Cl.
*G03F 7/00* (2006.01)
*G03F 1/62* (2012.01)
*G03F 1/82* (2012.01)

(52) U.S. Cl.
CPC ............ *G03F 7/70925* (2013.01); *G03F 1/62* (2013.01); *G03F 1/82* (2013.01); *G03F 7/70033* (2013.01)

(58) Field of Classification Search
CPC .......... G03F 1/62; G03F 1/82; G03F 7/70033; G03F 7/70925
See application file for complete search history.

(56) References Cited

U.S. PATENT DOCUMENTS

2009/0246644 A1    10/2009   Chakravorty et al.
2011/0013164 A1*    1/2011   Nayfeh ............ H01L 21/68714
                                                              355/53

(Continued)

FOREIGN PATENT DOCUMENTS

EP             4020087 A1      6/2022

*Primary Examiner* — Deoram Persaud
(74) *Attorney, Agent, or Firm* — Harrity & Harrity, LLP

(57) ABSTRACT

Some implementations described herein provide a reticle cleaning device and a method of use. The reticle cleaning device includes a support member configured for extension toward a reticle within an extreme ultraviolet lithography tool. The reticle cleaning device also includes a contact surface disposed at an end of the support member and configured to bond to particles contacted by the contact surface. The reticle cleaning device further includes a stress sensor configured to measure an amount of stress applied to the support member at the contact surface. During a cleaning operation in which the contact surface is moving toward the reticle, the stress sensor may provide an indication that the amount of stress applied to the support member satisfies a threshold. Based on satisfying the threshold, movement of the contact surface and/or the support member toward the reticle ceases to avoid damaging the reticle.

19 Claims, 13 Drawing Sheets

Related U.S. Application Data

(60) Provisional application No. 63/202,829, filed on Jun. 25, 2021.

(56) References Cited

U.S. PATENT DOCUMENTS

| | | | |
|---|---|---|---|
| 2014/0268074 A1* | 9/2014 | Chien | G03F 7/70741 355/30 |
| 2016/0158807 A1 | 6/2016 | Robinson | |
| 2019/0353475 A1* | 11/2019 | Walecki | G03F 9/7046 |
| 2020/0057383 A1 | 2/2020 | Shih et al. | |
| 2020/0166855 A1 | 5/2020 | Judge et al. | |
| 2022/0413401 A1 | 12/2022 | Hsu et al. | |

* cited by examiner

RETICLE CLEANING DEVICE AND METHOD OF USE

CROSS-REFERENCE TO RELATED APPLICATION

This application is a continuation of U.S. patent application Ser. No. 17/655,877, filed on Mar. 22, 2022, which claims priority to Provisional Patent Application No. 63/202,829, filed on Jun. 25, 2021, the contents of which are incorporated herein by reference in their entireties.

BACKGROUND

As semiconductor device sizes continue to shrink, some lithography technologies suffer from optical restrictions, which lead to resolution issues and reduced lithography performance. In comparison, extreme ultraviolet (EUV) lithography can achieve much smaller semiconductor device sizes and/or feature sizes through the use of reflective optics and radiation wavelengths of approximately 13.5 nanometers or less.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
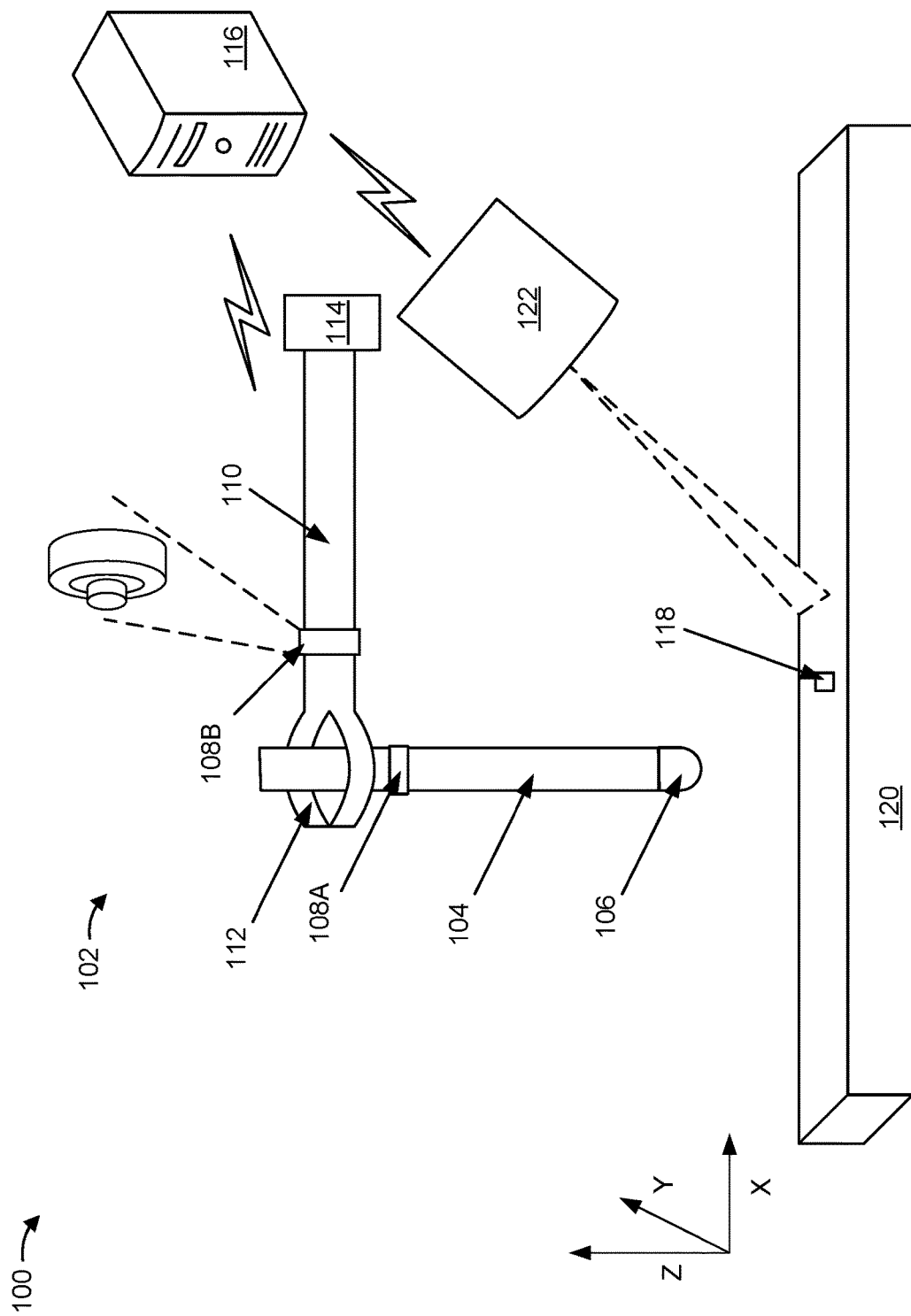
FIG. 1 is a diagram of an example extreme ultraviolet (EUV) lithography tool described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

To perform extreme ultraviolet (EUV) lithography, light (e.g., EUV light) may be reflected from, a reticle (e.g., a mask) that has a pattern configured to shape the light before projection to a semiconductor device. Interference from particles on the reticle can affect a precision of the EUV lithography on the semiconductor device. For example, a particle (e.g., a fall-on particle) in a gas surrounding the reticle may land on, and stick to, the reticle, (e.g., on a front side or a backside of the reticle). Particle at the backside (direct contact to the reticle stage) would cause overlay shift/distortion or image defocus, while the front side particle may cause CD error, undesired pattern if no pellicle is present. When the light is projected onto the reticle (e.g., in a scanning operation for lithography), the particle blocks and/or reflects the light, which distorts an intended shape of the light for projection to the semiconductor device. The distorted shape of the light may cause imprecision of etching of the semiconductor device, which may cause portions of the semiconductor device to fail and/or which may cause the semiconductor device to fail. Failure of the semiconductor device and/or portions of the semiconductor device may consume resources and increase manufacturing times to produce a number of functioning semiconductor devices.

To reduce particles on the reticle from blocking and/or reflecting light, an inspection tool may be used to detect the particles on the reticle. Once detected, a cleaning device may use a contact-based cleaning tool to remove the particles. The contact-based cleaning tool may include an adhesive at a contact surface, with the adhesive configured to bond the particles to the contact surface. The cleaning device may move the contact-based cleaning tool to one of a set of defined positions such that the contact surface is in contact with the particles on the reticle. However, based on moving the contact-based cleaning tool to one of the set of defined positions, the contact-based cleaning tool may apply pressure to the reticle, which may damage the reticle. Damage to the reticle may distort an intended shape of the light for projection to the semiconductor device, which distortion may exceed distortion that may have been caused by leaving the particles on the reticle. As described above, the distorted shape of the light may cause imprecision of etching of the semiconductor device, which may cause portions of the semiconductor device to fail and/or which may cause the semiconductor device to fail. Failure of the semiconductor device and/or portions of the semiconductor device may consume resources and increase manufacturing times to produce a number of functioning semiconductor devices.

Some implementations described herein provide techniques and apparatuses for a reticle cleaning device and a method of use for the reticle cleaning device. The reticle cleaning device (e.g., a BX100 or other EUV reticle backside inspection and cleaning tool) may be configured to reduce or prevent damage to a backside surface of a reticle (e.g., a surface opposite a pattern for lithography). For example, the reticle cleaning device (e.g., a sticker and/or tape tool) may be configured to remove a particle (e.g., a fall on particle) from the backside surface of the reticle without applying an amount of stress, by the reticle cleaning device to the reticle, that satisfies a threshold (e.g., selected from a range from approximately 0 Newtons to approximately 100 Newtons).

The reticle cleaning device may receive an indication (e.g., from an inspection tool, such as an optical inspection tool) that the particle is on the backside surface of the reticle. Additionally, or alternatively, the reticle cleaning device may receive an indication of a location of the particle on the backside surface of the reticle, a size of the particle, and/or a material of the particle. The reticle cleaning device may initiate movement of a support member (of the reticle cleaning device) toward the particle and/or the reticle. The reticle cleaning device may cease the movement of the support member toward the particle based on receiving an indication that an amount of stress applied to the support member satisfies a threshold.

In some examples, a stress sensor of the reticle cleaning device may measure an amount of stress applied to the support member (e.g., at a contact surface of the support member) during the movement of the support member. The stress sensor may provide an indication (e.g., an alert) to a controller of the reticle cleaning device to indicate satisfaction of the threshold, and the controller may provide (e.g., to an actuator) an indication to cease the movement of the support member based on the indication from the stress sensor. The stress sensor may be disposed on the support member and/or on a loader configured to couple to the support member. In some implementations, the controller may (e.g., after providing the indication to cease the movement of the support member) provide an indication to initiate movement of the support member (e.g., the contact surface) away from the reticle based on the amount of stress applied to the support member satisfying the threshold.

Based on the support member ceasing movement toward the reticle upon detection of an amount of stress that satisfies a threshold, the support member has a decreased likelihood of forcing the particle and/or the contact surface into the backside surface of the reticle. Based on decreasing the likelihood of forcing the particle and/or the contact surface into the backside surface of the reticle, the reticle cleaning device has a decreased likelihood of distorting an intended shape of light received at the reticle for projection to a semiconductor device (e.g., a substrate). The decreased likelihood of distorting the intended shape of the light may improve precision of etching of the semiconductor device, which may reduce a likelihood of portions of the semiconductor device failing and/or the entire semiconductor device failing. This may conserve resources and reduce manufacturing times to produce a number of functioning semiconductor devices.

FIG. 1 is a diagram of an example EUV lithography tool 100 described herein. Although some components of the EUV lithography tool 100 are shown in FIG. 1, additional components that are not shown may be included in the EUV lithography tool 100. For example, the EUV lithography tool 100 may include a light source, one or more mirrors and/or lenses, and/or one or more filters. Additionally, components of the EUV lithography tool 100 may have different sizes and/or shapes than those shown in FIG. 1.

As shown in FIG. 1, the EUV lithography tool 100 includes a reticle cleaning device 102. The reticle cleaning device 102 includes a support member 104 having a contact surface 106 disposed at an end of the support member 104. The support member 104 may include a rigid material, such as metallic material, a glass material, a plastic and/or a polymer-based material, among other examples. In some implementations, the support member 104 may include a flexible material, such as a flexible polymer-based material, a fibrous material, and/or an organic material, among other examples. The support member 104 may include an elongate member have a length in a range of approximately 15 centimeters (cm) to approximately 17 cm, or another length that is based on a size of the EUV lithography tool 100 and/or a chamber of the EUV lithography tool 100. Other lengths of the support member 104 are within the scope of the present disclosure. The support member 104 may be configured for extension toward a reticle and/or a particle within the EUV lithography tool 100.

The contact surface 106 may include an adhesive material and/or a base material. For example, the adhesive material may be disposed on and/or around the base material at the contact surface 106. In some implementations, the adhesive material and/or the base material include a deformable material, such as a flexible polymer-based material, that is configured to deform based on application of force by the support member 104 to press the contact surface 106 against an object. The contact surface 106 may be configured to bond to particles contacted by the contact surface 106 for removal from a reticle. The contact surface 106 may have a rounded end extending from the support member 104, with a curvature having an angle of approximately 1.5 steradians. The contact surface 106 may have a length of approximately 3 millimeters (mm). Other angles and/or lengths of the contact surface 106 are within the scope of the present disclosure.

A stress sensor 108A may be disposed on the support member 104. The stress sensor 108A is configured to measure (e.g., detect) an amount of stress applied to the support member 104 at the contact surface 106. In some implementations, the stress sensor 108A is disposed across a width (e.g., a diameter) of the support member 104. In this way, the stress sensor may better detect a compression force on the support member 104. In some implementations, the stress sensor 108 is disposed along a length of the support member 104. In this way, the stress sensor may better detect a force that urges the support member 104 to bend or flex. The stress sensor 108A may be disposed at or near a distal end of the support member 104 (e.g., an end that includes the contact surface 106) or may be disposed at or near a proximal end of the support member 104 (e.g., an end that is opposite the contact surface 106). The stress sensor 108A may include a pressure sensor configured to detect pressure applied by, or applied to, one or both of the support member 104 or the contact surface 106. Additionally, or alternatively, the stress sensor 108A may include a load cell, a strain gauge, a piezoelectric force sensor, a capacitive force sensor, and/or a magnetoelastic force sensor, among other examples.

The support member 104 may be coupled to a loader 110 via a clamp 112 or another coupling device. The loader 110 may be configured to couple the support member 104 to an actuator 114 that controls movement of the support member 104. The actuator 114 may be mounted to another component of the EUV lithography tool 100 and/or may be mounted to a sidewall of a chamber of the EUV lithography tool 100. In some implementations, the loader 110 is configured to removably couple to the support member 104. For example, the loader 110 may be configured to uncouple from the support member 104 and couple to a replacement support member. In some implementations, a stress sensor 108B is disposed on the loader 110. In some implementations, the reticle cleaning device 102 includes only the stress sensor 108A or the stress sensor 108B and not both (e.g., to reduce a cost of the reticle cleaning device 102). For example, based on including the stress sensor 108B, the reticle cleaning device 102 may detect the stress applied to any support member coupled to the loader 110 even after replacing the support member 104. Alternatively, the reticle cleaning device 102 may include both of the stress sensor 108A and the stress sensor 108B (e.g., to improve accuracy of the measurement of the amount of stress applied to the support member 104).

The reticle cleaning device 102 may include a controller 116 configured to receive one or more indications of an amount of stress applied to the support member 104. For example, the controller 116 may receive the one or more indications via a bus (e.g., a wired communication medium) or via wireless communication (e.g., using a wireless local area network communication standard, an industrial internet of things (IIoT) wireless communication standard, or a short-range wireless communication standard, among other examples). The controller 116 may receive the one or more indications from the stress sensor(s) 108A and/or 108B (collectively referred to herein as the "stress sensor 108" or the "stress sensors 108"). In some implementations, the stress sensor 108 provides indications of measurements of the amount of stress applied to the support member 104 regardless of the measurements. In this way, the controller 116 may monitor patterns in the measurements and may be able to predict when the amount of pressure will satisfy the threshold. In some implementations, the stress sensor 108 provides indications of measurements of the amount of stress applied to the support member 104 (e.g., an alert) only when the measurements satisfy a threshold (e.g., a threshold associated with an amount of stress applied to the support member 104). In this way, the stress sensor 108, the actuator 114, and/or the controller 116 may conserve power resource and/or communication resources based on reducing a number of communications. In some implementations, the stress sensor 108 provides indications of measurements of the amount of stress applied to the support member 104 only when the actuator 114 is moving the support member 104 (e.g., towards a reticle or away from the reticle, among other examples). In this way, the stress sensor 108, the actuator 114, and/or the controller 116 may conserve power resource and/or communication resources.

In some implementations, the reticle cleaning device 102 is configured to extend the support member 104 and the contact surface 106 toward a particle 118 (e.g., a fall-on particle) disposed on a surface of a reticle 120. The particle 118 may be disposed on a backside surface (e.g., a surface that is opposite a surface that includes a pattern for lithography). In some implementations, the reticle cleaning device 102 is configured to extend the support member 104 and the contact surface 106 toward the particle 118 based on receiving an indication that the particle 118 is disposed on the surface of the reticle and/or obtaining location information associated with the particle 118. For example, an inspection tool 122 (e.g., an optical inspection tool) may inspect a surface of the reticle 120 to locate the particle 118. The inspection tool 122 may transmit an indication to the controller 116 (e.g., directly or indirectly and/or using a bus or wireless communication, as described herein) that the particle 118 is detected on the surface of the reticle 120 and a location of the particle 118 on the reticle 120. In some implementations, the inspection tool 122 may transmit an indication of characteristics of the particle 118, such as a size of the particle 118, a height of the particle 118, and/or a material of the particle 118. The inspection tool 122 may be mounted to another component of the EUV lithography tool 100 and/or may be mounted to a sidewall of a chamber of the EUV lithography tool 100.

The controller 116 may be configured to receive, before initiating the movement of the contact surface 106 toward the reticle 120, an indication that a particle 118 is on a surface of the reticle 120 within the EUV lithography tool 100 and/or an indication of the characteristics of the particle 118. The controller 116 may be configured to provide, based on obtaining location information associated with the particle 118 disposed on the reticle 120, signaling to the actuator 114 to initiate movement of the contact surface 106 toward the reticle 120 (e.g., toward the particle 118) within the EUV lithography tool 100 (e.g., in a horizontal plane, in a vertical plane, toward the reticle 120, or away from the reticle 120).

The controller 116 may be configured to provide, based on receiving the indications of measurements of the amount of stress from the stress sensor 108, signaling to the actuator 114 to cease the movement of the contact surface 106 within the EUV lithography tool 100 (e.g., toward the reticle 120). In some implementations, the controller 116 is configured to provide the signaling to the actuator 114 to cease the movement based on an indication that an amount of stress applied to the support member 104 satisfies a threshold. The threshold may be based on a material of the particle 118 and/or a material of the reticle 120 (e.g., a material of the backside surface of the reticle 120). In this way, the threshold may account for a rigidity and/or a resilience of the material of the reticle 120 and/or the rigidity and/or the resilience of the material of the reticle 120 compared to a rigidity and/or a resilience of the particle 118. This may allow a tolerance for the amount of stress to be based on an amount of stress that the reticle 120 can tolerate without damage.

The actuator 114 may receive the signaling and cease the movement. In some implementations, the actuator 114 may rotate the contact surface 106 and/or the support member 104 upon ceasing the movement of the support member 104 toward the particle 118. This may decrease a likelihood of dropping the particle 118 back onto the reticle 120.

The controller 116 may be configured to provide, after signaling to the actuator 114 to cease the movement, signaling to the actuator 114 to initiate movement of the contact surface 106 away from the reticle 120 within the EUV lithography tool 100. In some implementations, the signaling to cease the movement toward the reticle 120 and the signaling to initiate movement away from the reticle 120 may be included in a same signaling message.

The actuator 114 may receive the signaling and initiate the movement away from the reticle 120. In some implementations, the actuator 114 may rotate the contact surface 106 and/or the support member 104 upon initiating the movement of the support member 104 away from the particle 118. This may decrease a likelihood of dropping the particle 118 back onto the reticle 120.

As indicated above, FIG. 1 is provided as an example. Other examples may differ from what is described with regard to FIG. 1.

FIGS. 2A-2G are diagrams of an example implementation 200 described herein. As shown in FIGS. 2A-2G, example implementation 200 includes tools and components associated with the EUV lithography tool 100 described in connection with FIG. 1. As shown in FIGS. 2A-2G a reticle cleaning device 102 may include a support member 104, a contact surface 106, a stress sensor 108, a loader 110 coupled to the support member 104 via a clamp 112 or another coupling device, an actuator 114, and a controller 116. A particle 118 may be disposed on a backside surface of a reticle 120 installed in the EUV lithography tool 100. The EUV lithography tool 100 may include an inspection tool 122 configured to detect and/or locate the particle 118 on the backside surface of the reticle 120.

Figure 2A:
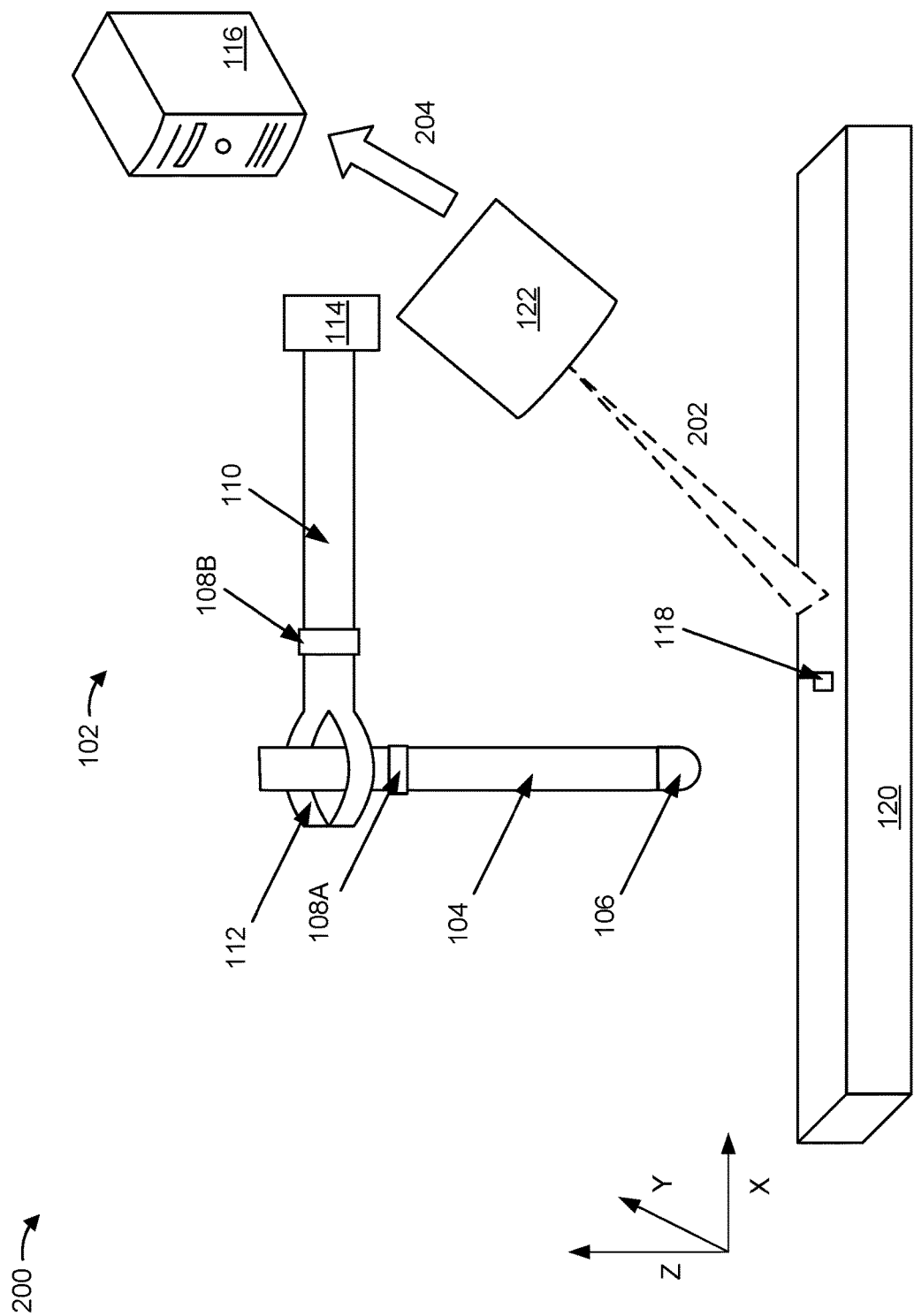
FIGS. 2A-2G are diagrams of an example implementation described herein.

As shown in FIG. 2A, and by reference number 202, the inspection tool 122 detects the particle 118 on the reticle 120. In some implementations, the inspection tool 122 may use a camera, a radio wave detection system, and/or a lidar-based system, among other examples, to detect the particle 118. The inspection tool 122 may obtain information associated with one or more characteristics of the particle 118, such as a height of the particle 118, a material of the particle 118, and/or a location of the particle (e.g., a 2-dimensional location in a lateral plane of the surface of the reticle 120).

As shown by reference number 204, the inspection tool 122 may provide, to the controller 116, an indication that the particle 118 is on the surface of the reticle 120 within the EUV lithography tool 100. In some implementations, the inspection tool 122 may also provide an indication of the one or more characteristics of the particle 118. The inspection tool 122 may provide the indication via a wireless local area network communication standard, an industrial internet of things (IIoT) wireless communication standard, or a short-range wireless communication standard, among other examples.

Figure 2B:
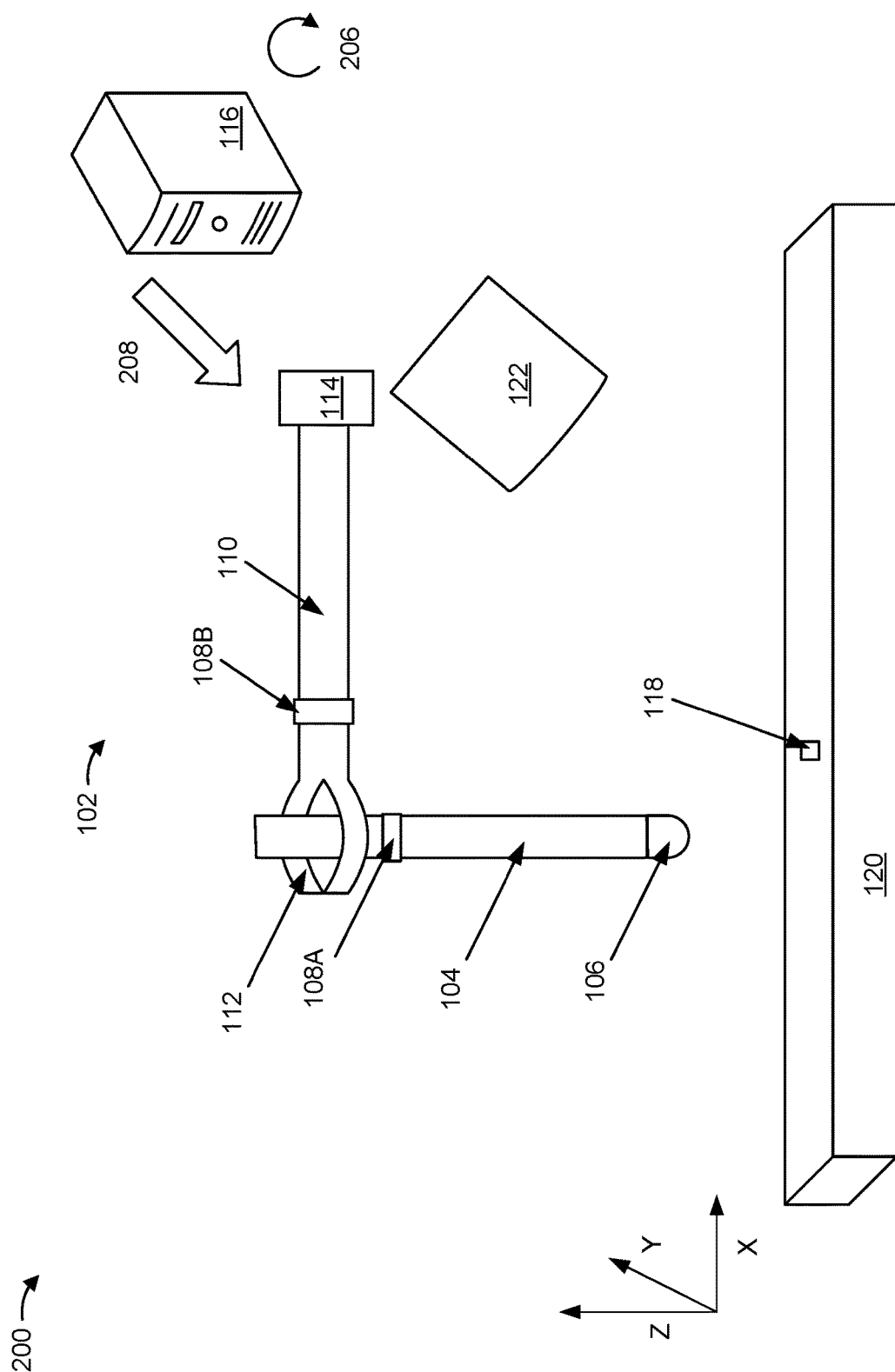

As shown in FIG. 2B, and by reference number 206, the controller 116 may determine controls for moving the support member 104 and the contact surface 106 to the particle 118 to remove the particle 118 from the reticle 120. For example, the controller 116 may determine controls to provide to the actuator 114 to move the contact surface 106 to a position where the contact surface 106 is above (e.g., directly above) the particle 118. Additionally, or alternatively, the controller 116 may determine a height to which the contact surface 106 is to be moved to contact the particle 118. The controller 116 may further determine a threshold for an amount of stress that may be applied to the support member 104 before ceasing movement of the support member 104 toward the reticle 120 and the particle 118. In some implementations, the controller 116 determines the threshold based on a material of the reticle 120 and/or a material of the particle 118, among other examples.

As shown by reference number 208, the controller 116 provides signaling to initiate movement of the support member 104 and the contact surface 106 toward the particle 118 and the reticle 120. The controller 116 may provide the signaling directly or indirectly to the actuator 114 and may use a bus or wireless communication, as described herein.

Figure 2C:
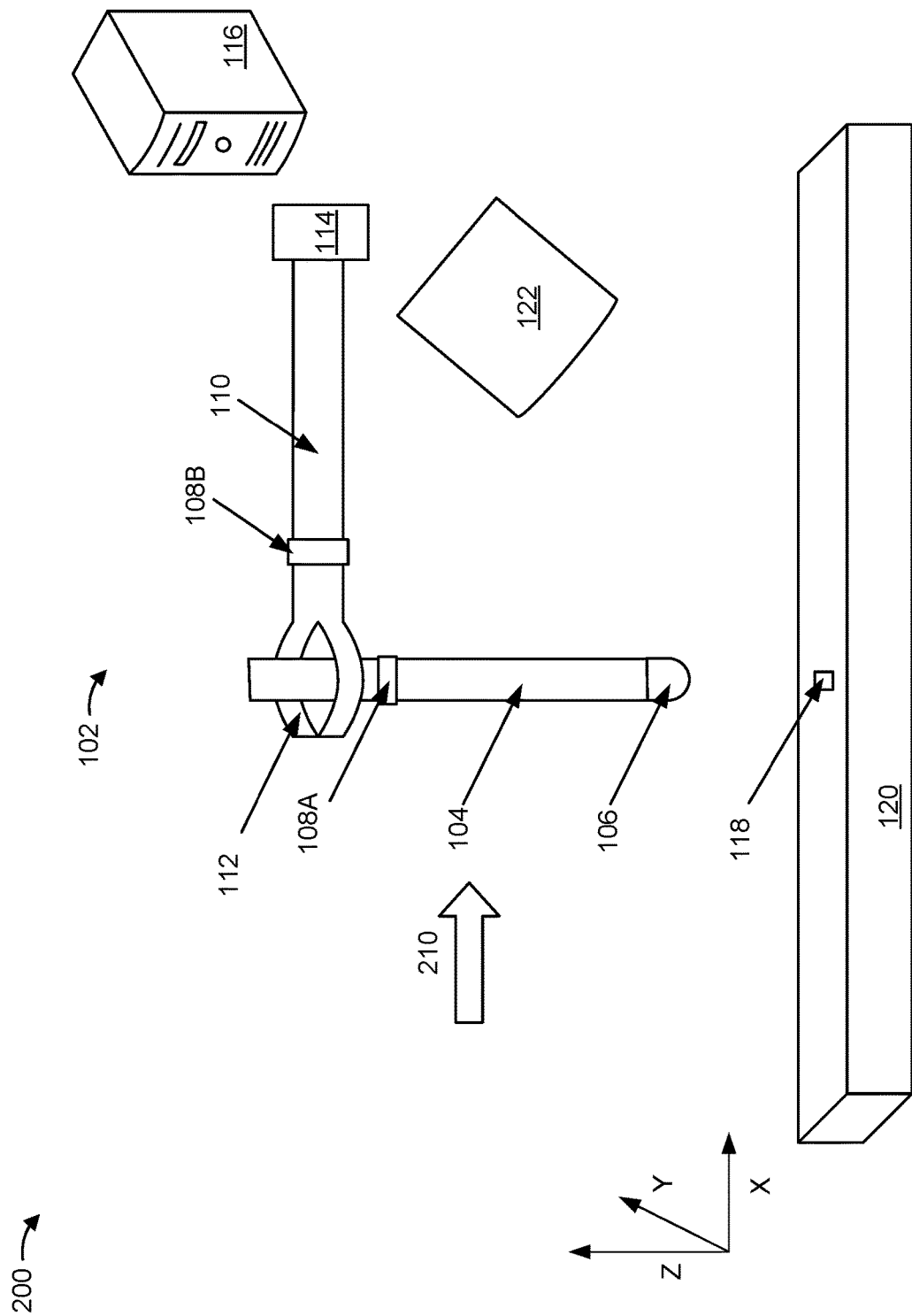

As shown in FIG. 2C, and by reference number 210, the actuator 114 may initiate movement of the support member 104 in a lateral plane (e.g., in an X-Y plane) that corresponds to a lateral position of the particle 118. For example, the signaling may indicate, to the actuator, movements to apply to the loader 110 and/or the support member 104 to position the contact surface 106 above (e.g., directly above) the particle 118.

Figure 2D:
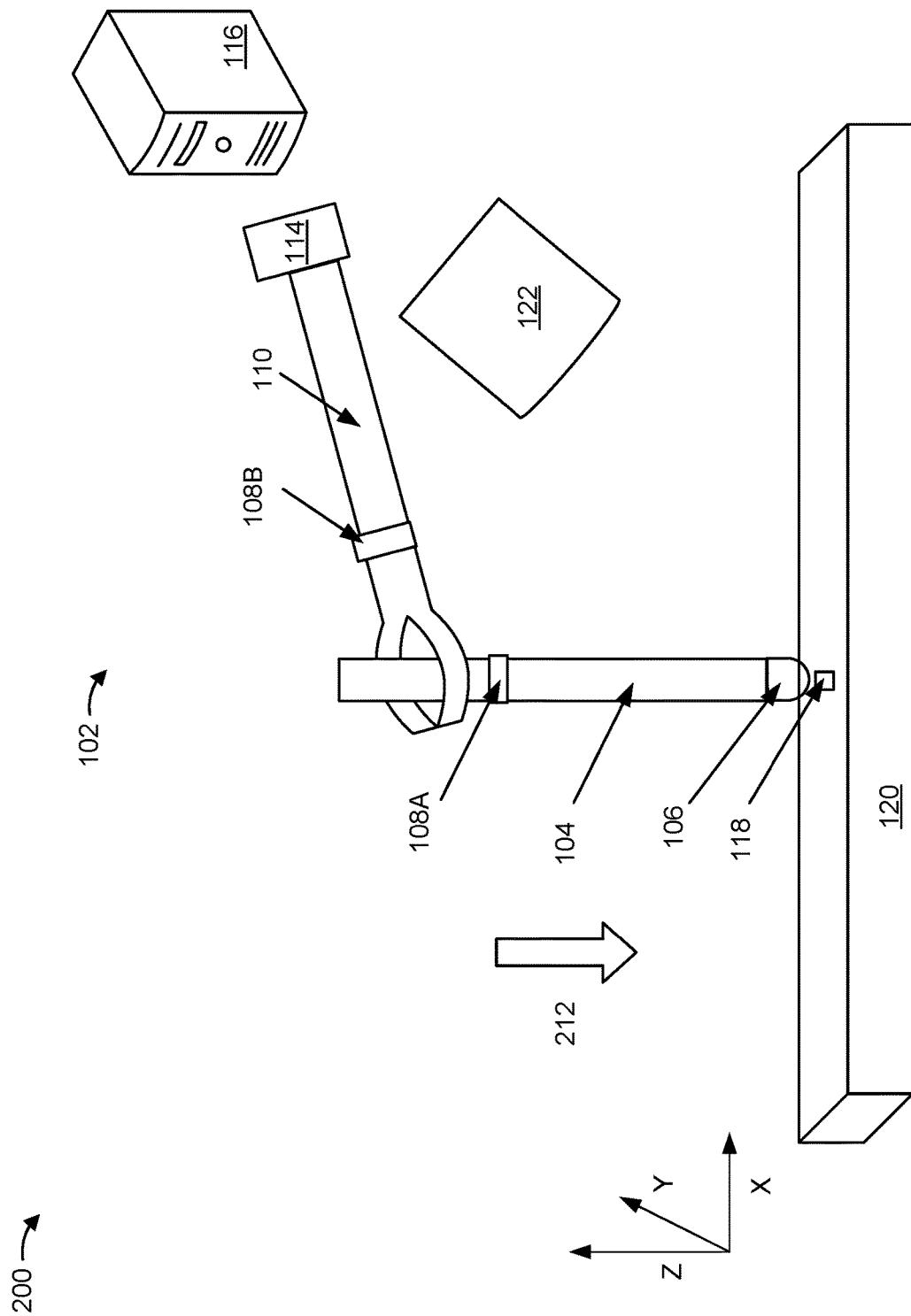

As shown in FIG. 2D, and by reference number 212, the actuator 114 may initiate movement of the support member 104 in a vertical direction (e.g., a Z direction) towards the reticle 120 that corresponds to an estimated vertical position of the particle 118. The estimated vertical position of the particle 118 may be based on a height of the particle 118 or a preconfigured height for removing particles from the reticle 120. In some aspects, the controller 116 may determine the height of the particle 118 based on signaling received from the inspection tool 122.

Figure 2E:
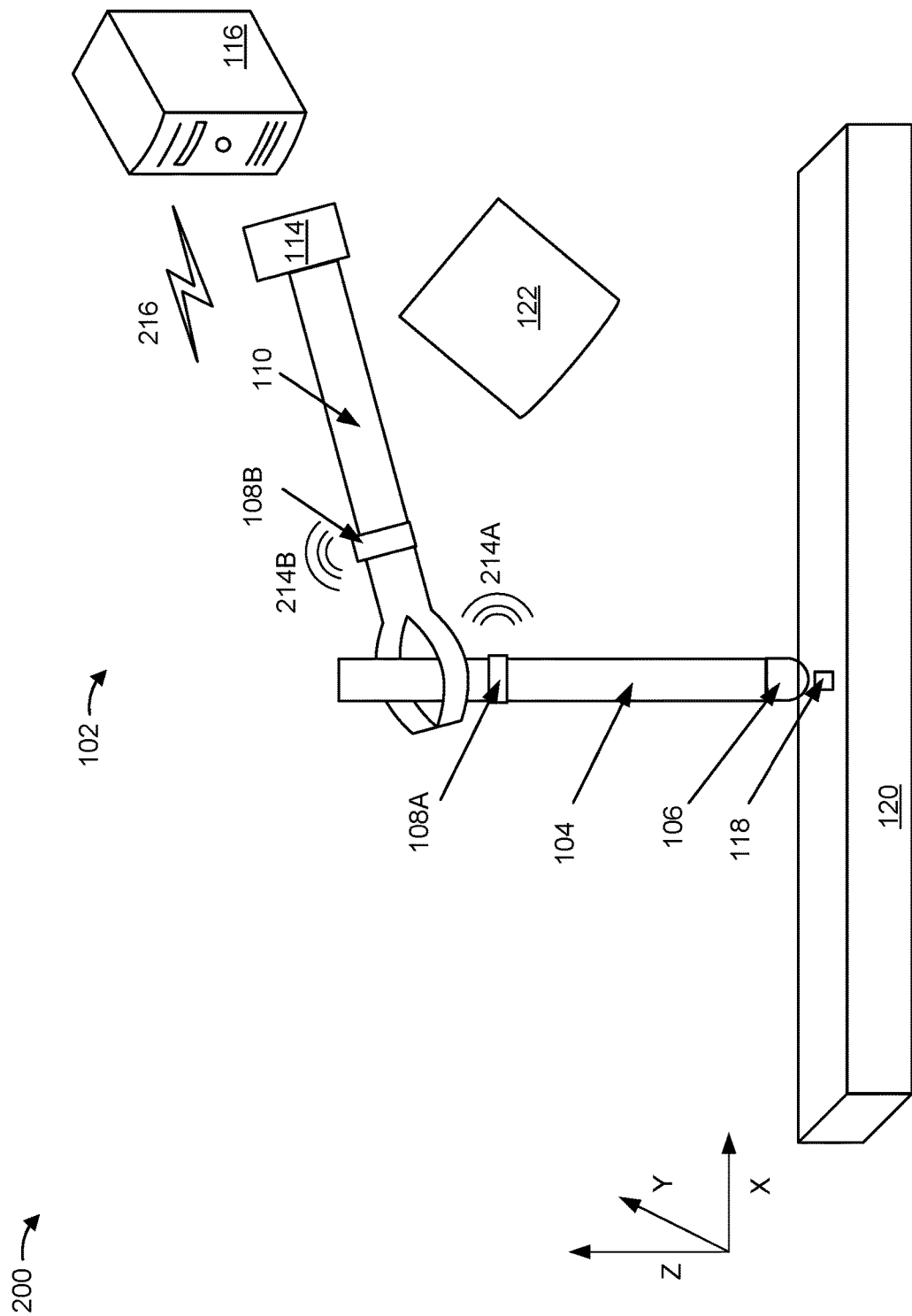

As shown in FIG. 2E, and by reference number 214, a stress sensor 108A coupled to the support member 104 and/or a stress sensor 108B coupled to the loader 110 may measure stress applied to the support member 104 and/or to the contact surface 106. As shown by reference number 216, the stress sensors 108 may provide, to the controller 116, an indication 214A and/or 214B that the threshold is satisfied by a measurement of the stress applied to the support member 104 and/or to the contact surface 106. For example, the stress sensor(s) 108 may provide an indication (e.g., an alert) to the controller 116 to indicate that the threshold is satisfied and/or that the movement of the support member 104 and/or the contact surface 106 should cease so as to prevent damage to the reticle 120. As described above, the stress sensor(s) 108 may provide indications of measurements performed (e.g., in real time as the measurements are determined) irrespective of whether those measurements satisfy the threshold, and the controller 116 may determine whether any of those measurements satisfy the threshold. In some implementations, the stress sensor(s) 108 may provide the indication(s) to the controller 116 via the actuator 114.

Figure 2F:
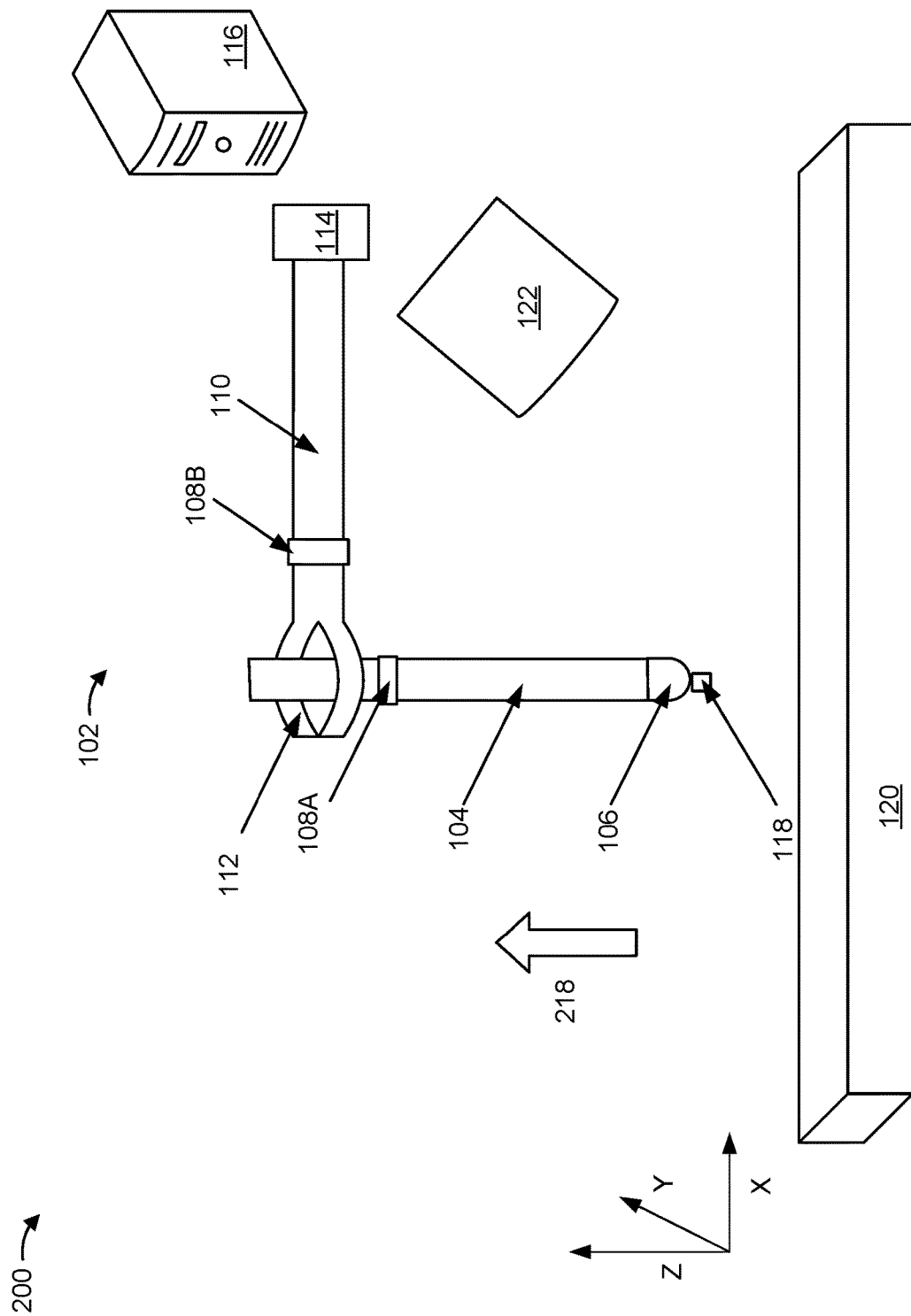

As shown in FIG. 2F, and by reference number 218, the actuator 114 may initiate movement of the support member 104 in a vertical direction away from the reticle 120. In some implementations, the actuator 114 may initiate the movement of the support member 104 away from the reticle 120 within the EUV lithography tool 100 based on the amount of stress applied to the support member 104 satisfying the threshold. In some implementations, the actuator 114 may move the support member 104 to a vertical height above the surface of the reticle 120 to reduce a likelihood of the contact surface 106 contacting the surface of the reticle 120 during subsequent lateral movements.

Figure 2G:
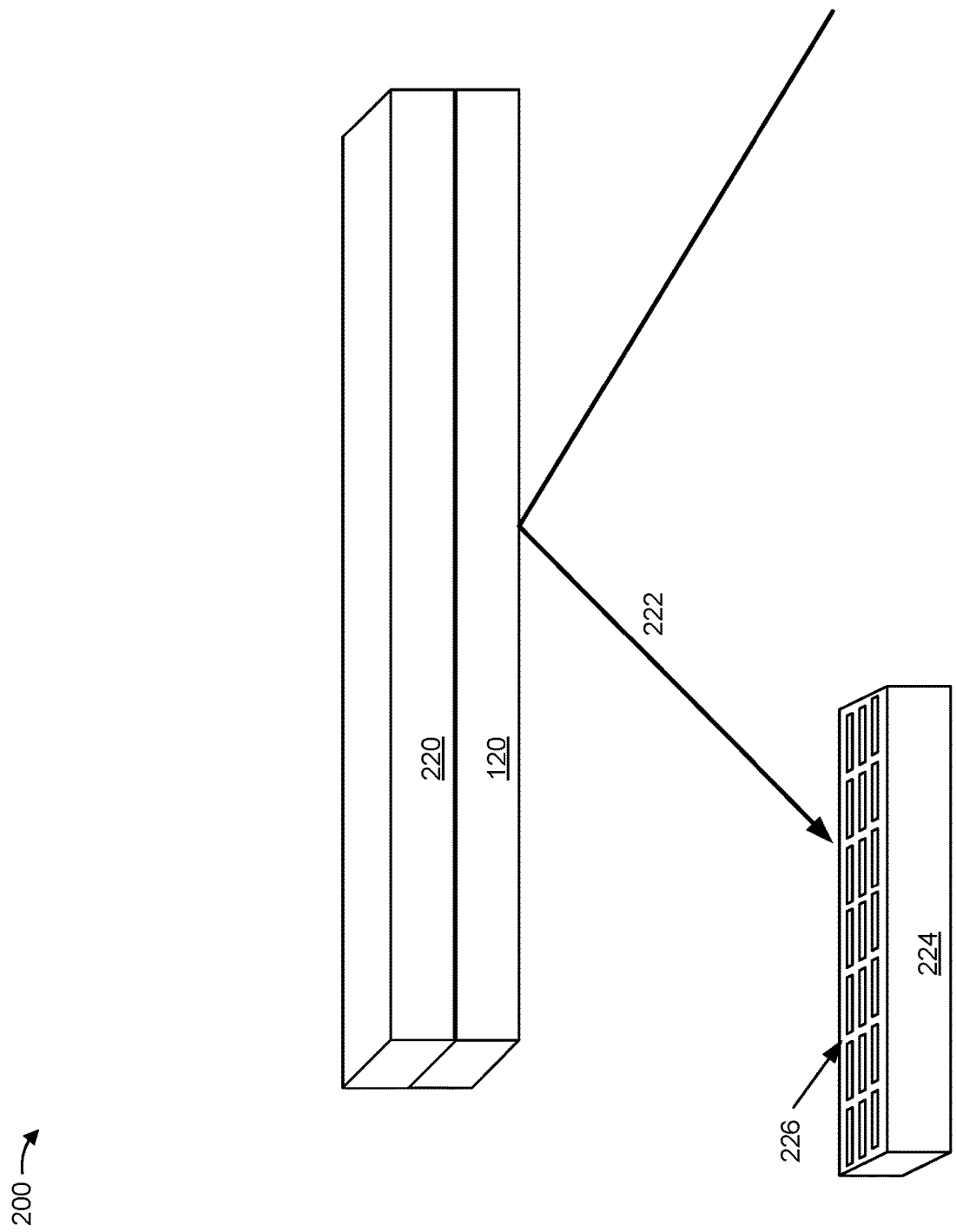

As shown in FIG. 2G, the reticle 120 may be coupled (e.g., mounted) to an electrostatic chuck 220 for operation in a lithography process. Based on having the particle 118 removed from the backside surface of the reticle 120, and based on avoiding damage to the backside surface of the reticle 120, the reticle 120 may couple to the electrostatic chuck 220 without deformity caused by a non-planar interface between the reticle 120 and the electrostatic chuck 220. In this way, the reticle 120 has a decreased likelihood of distorting an intended shape of light 222 (e.g., EUV radiation) projected onto (e.g., received at) the reticle 120 for projection to a wafer 224 (e.g., a wafer formed into a semiconductor device, a substrate for making the semiconductor device). In some implementations, the wafer 224 may have a photoresist 226 disposed on a surface (e.g., an upper surface). In some implementations, the wafer 224 may be configured to receive the light 222 to expose a photoresist 226 to the light 222. The light 222 may be exposed to the photoresist 226 and the wafer 224 in a pattern that matches the reticle 120. In this way, the reticle may transfer a pattern to the wafer 224 for subsequent semiconductor manufacturing processes, such as baking, developing, and/or etching.

Based on the reticle 120 having reduced or eliminated deformity from particles, the reticle 120 may have a decreased likelihood of distorting the intended shape of the light 222 and may improve precision of etching of the wafer, which may reduce a likelihood of portions of a semiconductor device that includes the wafer failing and/or the entire semiconductor device 224 failing. This may conserve resources and reduce manufacturing times to produce a number of functioning semiconductor devices.

As indicated above, FIGS. 2A-2G are provided as an example. Other examples may differ from what is described with regard to FIGS. 2A-2G. The number and arrangement of devices shown in FIGS. 2A-2G are provided as an example. In practice, there may be additional devices, fewer devices, different devices, or differently arranged devices than those shown in FIGS. 2A-2G. Furthermore, two or more devices shown in FIGS. 2A-2G may be implemented within a single device, or a single device shown in FIGS. 2A-2G may be implemented as multiple, distributed devices. Additionally, or alternatively, a set of devices (e.g., one or more devices) shown in FIGS. 2A-2G may perform one or more functions described as being performed by another set of devices shown in FIGS. 2A-2G.

Figure 3:
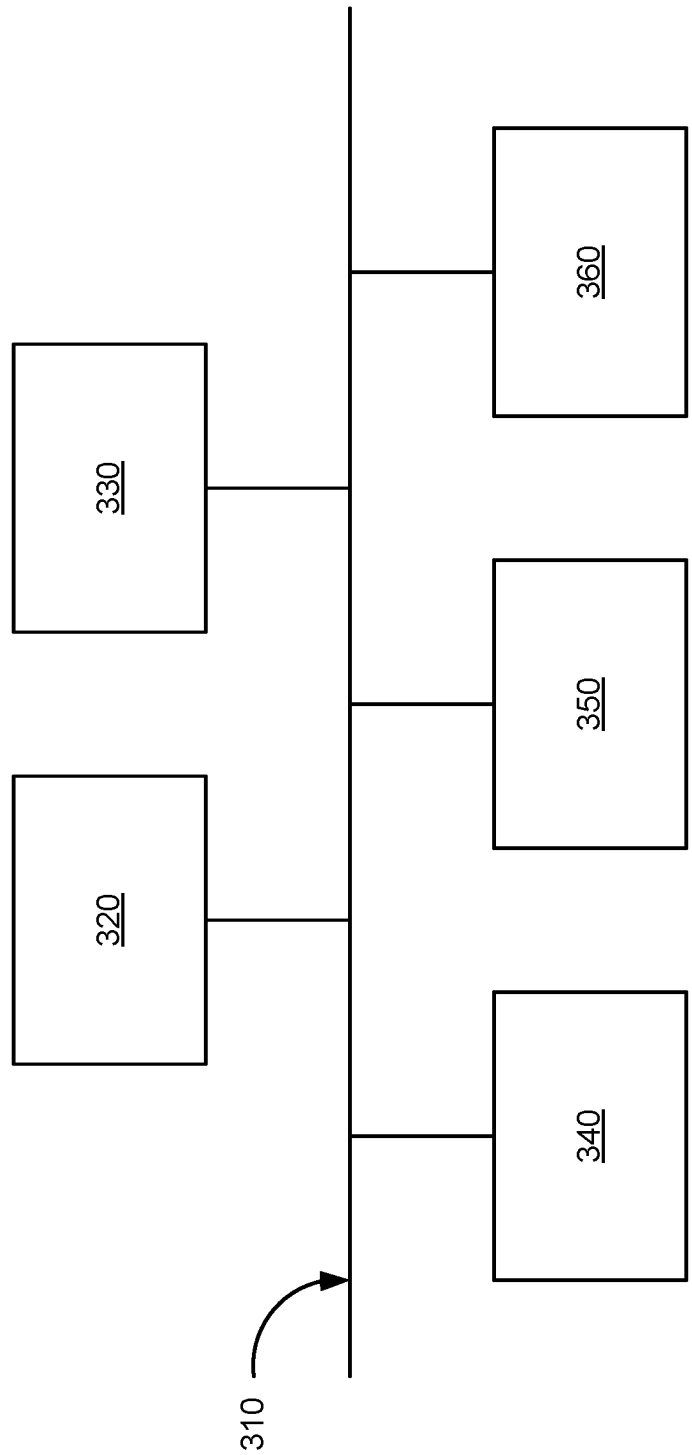
FIG. 3 is a diagram of example components of one or more devices of FIG. 1 described herein.

FIG. 3 is a diagram of example components of a device 300, which may correspond to the stress sensor(s) 108, the actuator 114, the controller 116, and/or the inspection tool 122 of FIGS. 1-2G. In some implementations, the stress sensor(s) 108, the actuator 114, the controller 116, and/or the inspection tool 122 may include one or more devices 300 and/or one or more components of device 300. As shown in FIG. 3, device 300 may include a bus 310, a processor 320, a memory 330, an input component 340, an output component 350, and a communication component 360.

Bus 310 includes one or more components that enable wired and/or wireless communication among the components of device 300. Bus 310 may couple together two or more components of FIG. 3, such as via operative coupling, communicative coupling, electronic coupling, and/or electric coupling. Processor 320 includes a central processing unit, a graphics processing unit, a microprocessor, a controller, a microcontroller, a digital signal processor, a field-programmable gate array, an application-specific integrated circuit, and/or another type of processing component. Processor 320 is implemented in hardware, firmware, or a combination of hardware and software. In some implementations, processor 320 includes one or more processors capable of being programmed to perform one or more operations or processes described elsewhere herein.

Memory 330 includes volatile and/or nonvolatile memory. For example, memory 330 may include random access memory (RAM), read only memory (ROM), a hard disk drive, and/or another type of memory (e.g., a flash memory, a magnetic memory, and/or an optical memory). Memory 330 may include internal memory (e.g., RAM, ROM, or a hard disk drive) and/or removable memory (e.g., removable via a universal serial bus connection). Memory 330 may be a non-transitory computer-readable medium. Memory 330 stores information, instructions, and/or software (e.g., one or more software applications) related to the operation of device 300. In some implementations, memory 330 includes one or more memories that are coupled to one or more processors (e.g., processor 320), such as via bus 310.

Input component 340 enables device 300 to receive input, such as user input and/or sensed input. For example, input component 340 may include a touch screen, a keyboard, a keypad, a mouse, a button, a microphone, a switch, a sensor, a global positioning system sensor, an accelerometer, a gyroscope, and/or an actuator. Output component 350 enables device 300 to provide output, such as via a display, a speaker, and/or a light-emitting diode. Communication component 360 enables device 300 to communicate with other devices via a wired connection and/or a wireless connection. For example, communication component 360 may include a receiver, a transmitter, a transceiver, a modem, a network interface card, and/or an antenna.

Device 300 may perform one or more operations or processes described herein. For example, a non-transitory computer-readable medium (e.g., memory 330) may store a set of instructions (e.g., one or more instructions or code) for execution by processor 320. Processor 320 may execute the set of instructions to perform one or more operations or processes described herein. In some implementations, execution of the set of instructions, by one or more processors 320, causes the one or more processors 320 and/or the device 300 to perform one or more operations or processes described herein. In some implementations, hardwired circuitry may be used instead of or in combination with the instructions to perform one or more operations or processes described herein. Additionally, or alternatively, processor 320 may be configured to perform one or more operations or processes described herein. Thus, implementations described herein are not limited to any specific combination of hardware circuitry and software.

The number and arrangement of components shown in FIG. 3 are provided as an example. Device 300 may include additional components, fewer components, different components, or differently arranged components than those shown in FIG. 3. Additionally, or alternatively, a set of components (e.g., one or more components) of device 300 may perform one or more functions described as being performed by another set of components of device 300.

Figure 4:
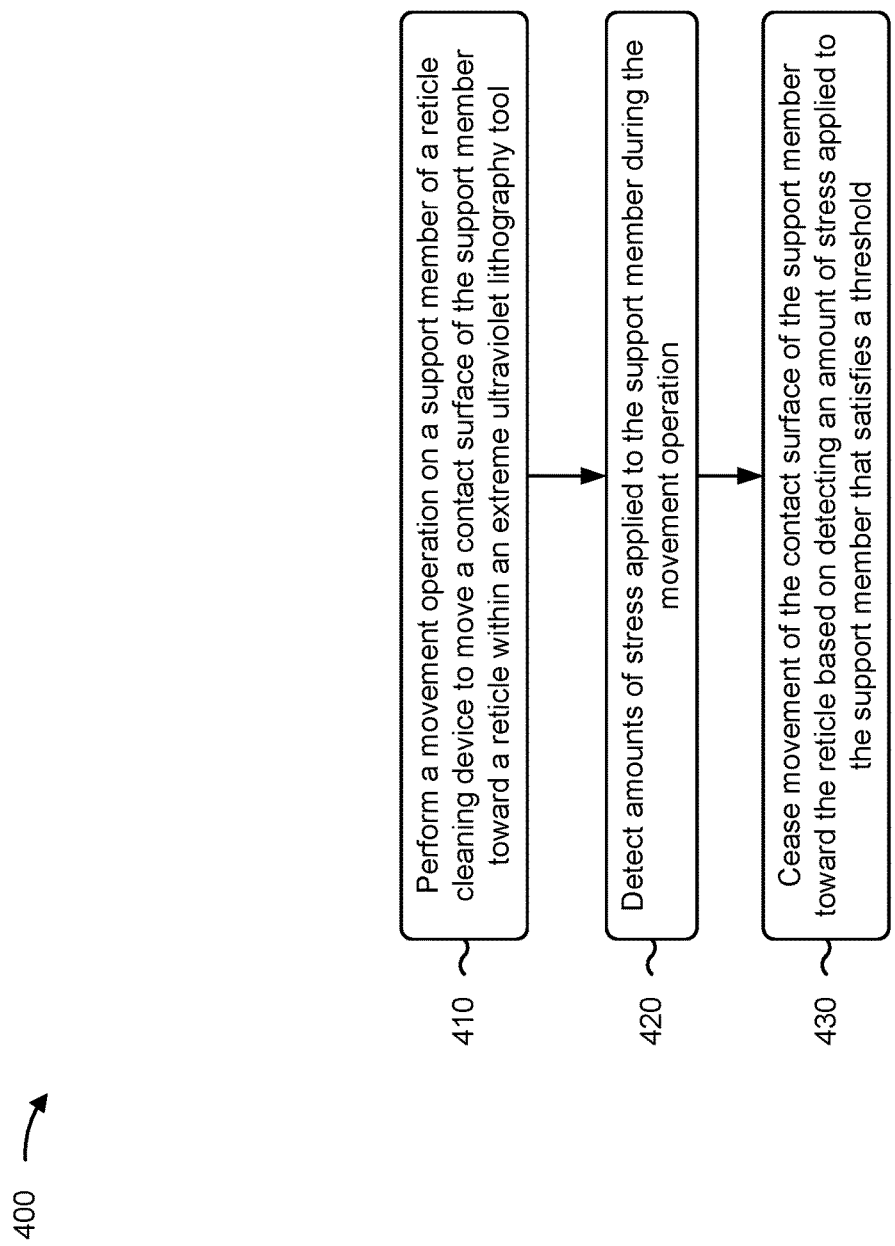
FIGS. 4-6 are flowcharts of example processes relating to using a reticle cleaning device described herein.

FIG. 4 is a flowchart of an example process 400 associated with a reticle cleaning device and method of use. In some implementations, one or more process blocks of FIG. 4 may be performed by a reticle cleaning device (e.g., reticle cleaning device 102). In some implementations, one or more process blocks of FIG. 4 may be performed by another device or a group of devices separate from or including the reticle cleaning device, such as an actuator (e.g., the actuator 114), an inspection tool (e.g., inspection tool 122) and/or a controller (e.g., controller 116). Additionally, or alternatively, one or more process blocks of FIG. 4 may be performed by one or more components of device 300, such as processor 320, memory 330, input component 340, output component 350, and/or communication component 360.

As shown in FIG. 4, process 400 may include performing a movement operation on a support member of a reticle cleaning device to move a contact surface of the support member toward a reticle within an EUV lithography tool (block 410). For example, the reticle cleaning device may perform a movement operation on a support member 104 of a reticle cleaning device 102 to move a contact surface 106 of the support member 104 toward a reticle 120 within an EUV lithography tool 100, as described above.

As further shown in FIG. 4, process 400 may include detecting amounts of stress applied to the support member during the movement operation (block 420). For example, the reticle cleaning device may detect amounts of stress applied to the support member 104 during the movement operation, as described above.

As further shown in FIG. 4, process 400 may include ceasing movement of the contact surface of the support member toward the reticle based on detecting an amount of stress applied to the support member that satisfies a threshold (block 430). For example, the reticle cleaning device may cease movement of the contact surface 106 of the support member 104 toward the reticle 120 based on detecting an amount of stress applied to the support member 104 that satisfies a threshold, as described above.

Process 400 may include additional implementations, such as any single implementation or any combination of implementations described below and/or in connection with one or more other processes described elsewhere herein.

In a first implementation, process 400 includes receiving an indication that a particle 118 is disposed on a backside surface of the reticle 120, wherein performing the movement operation is based on receiving the indication that the particle 118 is disposed on the backside surface of the reticle 120.

In a second implementation, alone or in combination with the first implementation, the indication that the particle 118 is disposed on the backside surface of the reticle 120 comprises one or more of an indication of a location of the particle 118 on the backside surface of the reticle 120, an indication of a size of the particle 118, or an indication of a height of the particle 118.

In a third implementation, alone or in combination with one or more of the first and second implementations, the threshold is based on one or more of a location of the particle 118 on the backside surface of the reticle 120, a size of the particle 118, or a height of the particle 118.

In a fourth implementation, alone or in combination with one or more of the first through third implementations, the movement operation comprises, before ceasing the movement of the contact surface 106 of the support member 104 toward the reticle 120 moving the contact surface 106 of the support member 104 to a position above a particle 118 disposed on the reticle 120, and initiating lowering of the contact surface 106 to a height that is based on a height of the particle 118.

In a fifth implementation, alone or in combination with one or more of the first through fourth implementations, process 400 includes rotating the support member 104 after ceasing the movement of the contact surface 106 of the support member 104 toward the reticle 120.

Although FIG. 4 shows example blocks of process 400, in some implementations, process 400 may include additional blocks, fewer blocks, different blocks, or differently arranged blocks than those depicted in FIG. 4. Additionally, or alternatively, two or more of the blocks of process 400 may be performed in parallel.

Figure 5:
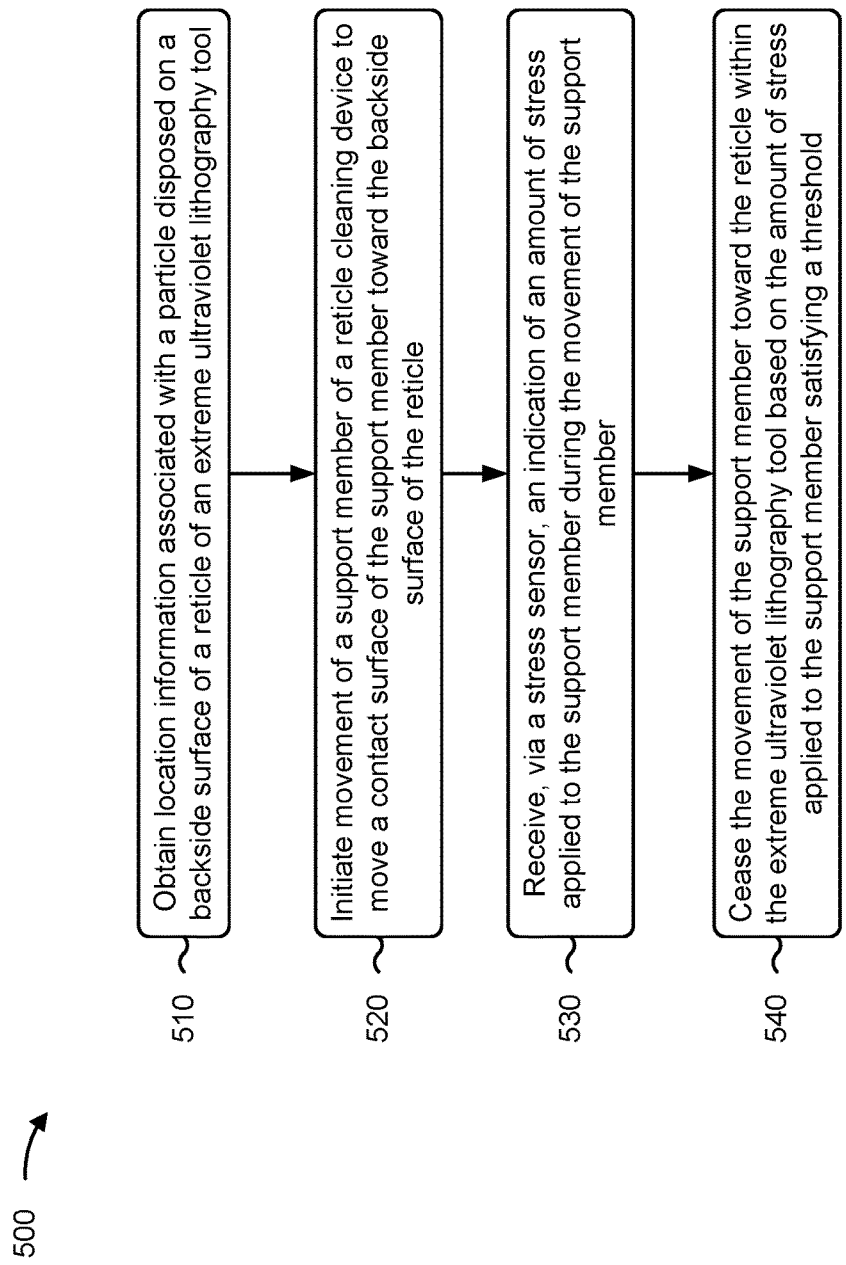

FIG. 5 is a flowchart of an example process 500 associated with a reticle cleaning device and method of use. In some implementations, one or more process blocks of FIG. 5 may be performed by a reticle cleaning device (e.g., reticle cleaning device 102). In some implementations, one or more process blocks of FIG. 5 may be performed by another device or a group of devices separate from or including the reticle cleaning device, such as an actuator (e.g., the actuator 114), an inspection tool (e.g., inspection tool 122) and/or a controller (e.g., controller 116). Additionally, or alternatively, one or more process blocks of FIG. 5 may be performed by one or more components of device 300, such as processor 320, memory 330, input component 340, output component 350, and/or communication component 360.

As shown in FIG. 5, process 500 may include obtaining location information associated with a particle disposed on a backside surface of a reticle of an EUV lithography tool (block 510). For example, the reticle cleaning device may obtain location information associated with a particle 118 disposed on a backside surface of a reticle 120 of an EUV lithography tool 100, as described above.

As further shown in FIG. 5, process 500 may include initiating movement of a support member of a reticle cleaning device to move a contact surface of the support member toward the backside surface of the reticle (block 520). For example, the reticle cleaning device may initiate movement of a support member 104 of a reticle cleaning device 102 to move a contact surface 106 of the support member 104 toward the backside surface of the reticle 120, as described above.

As further shown in FIG. 5, process 500 may include receiving, via a stress sensor, an indication of an amount of stress applied to the support member during the movement of the support member (block 530). For example, the reticle cleaning device may receive, via a stress sensor 108, an indication of an amount of stress applied to the support member 104 during the movement of the support member 104, as described above.

As further shown in FIG. 5, process 500 may include ceasing the movement of the support member toward the reticle within the EUV lithography tool based on the amount of stress applied to the support member satisfying a threshold (block 540). For example, the reticle cleaning device may cease the movement of the support member 104 toward the reticle 120 within the EUV lithography tool 100 based on the amount of stress applied to the support member 104 satisfying a threshold, as described above.

Process 500 may include additional implementations, such as any single implementation or any combination of implementations described below and/or in connection with one or more other processes described elsewhere herein.

In a first implementation, obtaining the location information associated with the particle 118 disposed on the backside surface of the reticle 120 comprises receiving the location information via an inspection tool 122 of the EUV lithography tool 100.

Although FIG. 5 shows example blocks of process 500, in some implementations, process 500 may include additional blocks, fewer blocks, different blocks, or differently arranged blocks than those depicted in FIG. 5. Additionally, or alternatively, two or more of the blocks of process 500 may be performed in parallel.

Figure 6:
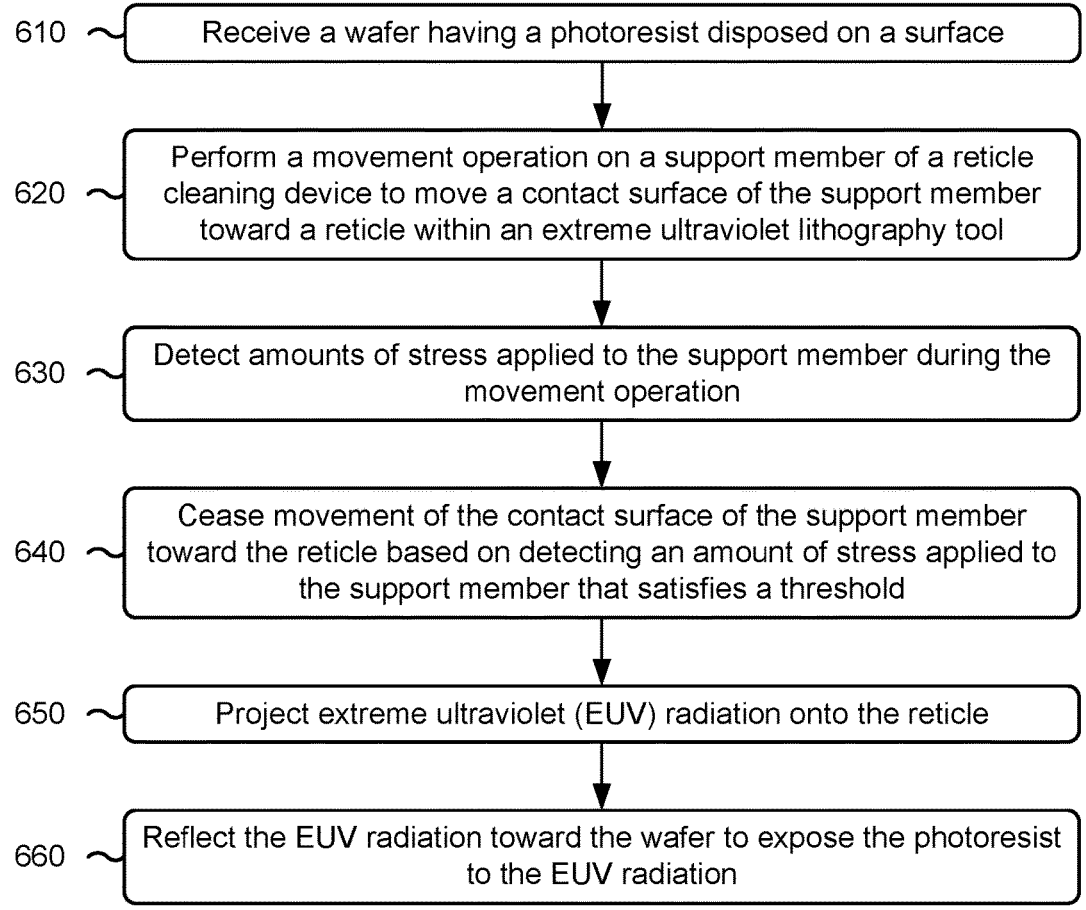

FIG. 6 is a flowchart of an example process 600 associated with a reticle cleaning device and method of use. In some implementations, one or more process blocks of FIG. 6 may be performed by a reticle cleaning device (e.g., reticle cleaning device 102) and/or an EUV lithography tool (e.g., EUV lithography tool 100). In some implementations, one or more process blocks of FIG. 6 may be performed by another device or a group of devices separate from or including the reticle cleaning device and/or the EUV lithography tool 100, such as an actuator (e.g., the actuator 114), an inspection tool (e.g., inspection tool 122) and/or a controller (e.g., controller 116). Additionally, or alternatively, one or more process blocks of FIG. 6 may be performed by one or more components of device 300, such as processor 320, memory 330, input component 340, output component 350, and/or communication component 360.

As shown in FIG. 6, process 600 may include receiving a wafer having a photoresist disposed on a surface (block 610). For example, the EUV lithography tool 100 may receive a wafer having a photoresist disposed on a surface, as described above.

As further shown in FIG. 6, process 600 may include performing a movement operation on a support member of a reticle cleaning device to move a contact surface of the support member toward a reticle within an extreme ultraviolet lithography tool (block 620). For example, the EUV lithography tool 100 may perform a movement operation on a support member 104 of a reticle cleaning device 102 to move a contact surface 106 of the support member 104 toward a reticle 120 within an EUV lithography tool 100, as described above.

As further shown in FIG. 6, process 600 may include detecting amounts of stress applied to the support member during the movement operation (block 630). For example, the EUV lithography tool 100 may detect amounts of stress applied to the support member 104 during the movement operation, as described above.

As further shown in FIG. 6, process 600 may include ceasing movement of the contact surface of the support member toward the reticle based on detecting an amount of stress applied to the support member that satisfies a threshold (block 640). For example, the EUV lithography tool 100 may cease movement of the contact surface 106 of the support member 104 toward the reticle 120 based on detecting an amount of stress applied to the support member 104 that satisfies a threshold, as described above.

As further shown in FIG. 6, process 600 may include projecting extreme ultraviolet (EUV) radiation onto the reticle (block 650). For example, the EUV lithography tool may project extreme ultraviolet (EUV) radiation onto the reticle, as described above.

As further shown in FIG. 6, process 600 may include reflecting the EUV radiation toward the wafer to expose the photoresist to the EUV radiation (block 660). For example, the EUV lithography tool 100 may reflect the EUV radiation 122 toward the wafer 224 to expose the photoresist 226 to the EUV radiation 122 (e.g., in a pattern associated with the reticle 120), as described above.

Process 600 may include additional implementations, such as any single implementation or any combination of implementations described below and/or in connection with one or more other processes described elsewhere herein.

In an implementation, process 600 includes obtaining location information associated with a particle 118 disposed on the backside surface of the reticle 120, wherein performing the movement operation is based on the location information associated with the particle 118.

Although FIG. 6 shows example blocks of process 600, in some implementations, process 600 includes additional blocks, fewer blocks, different blocks, or differently arranged blocks than those depicted in FIG. 6. Additionally, or alternatively, two or more of the blocks of process 600 may be performed in parallel.

Figure 7:
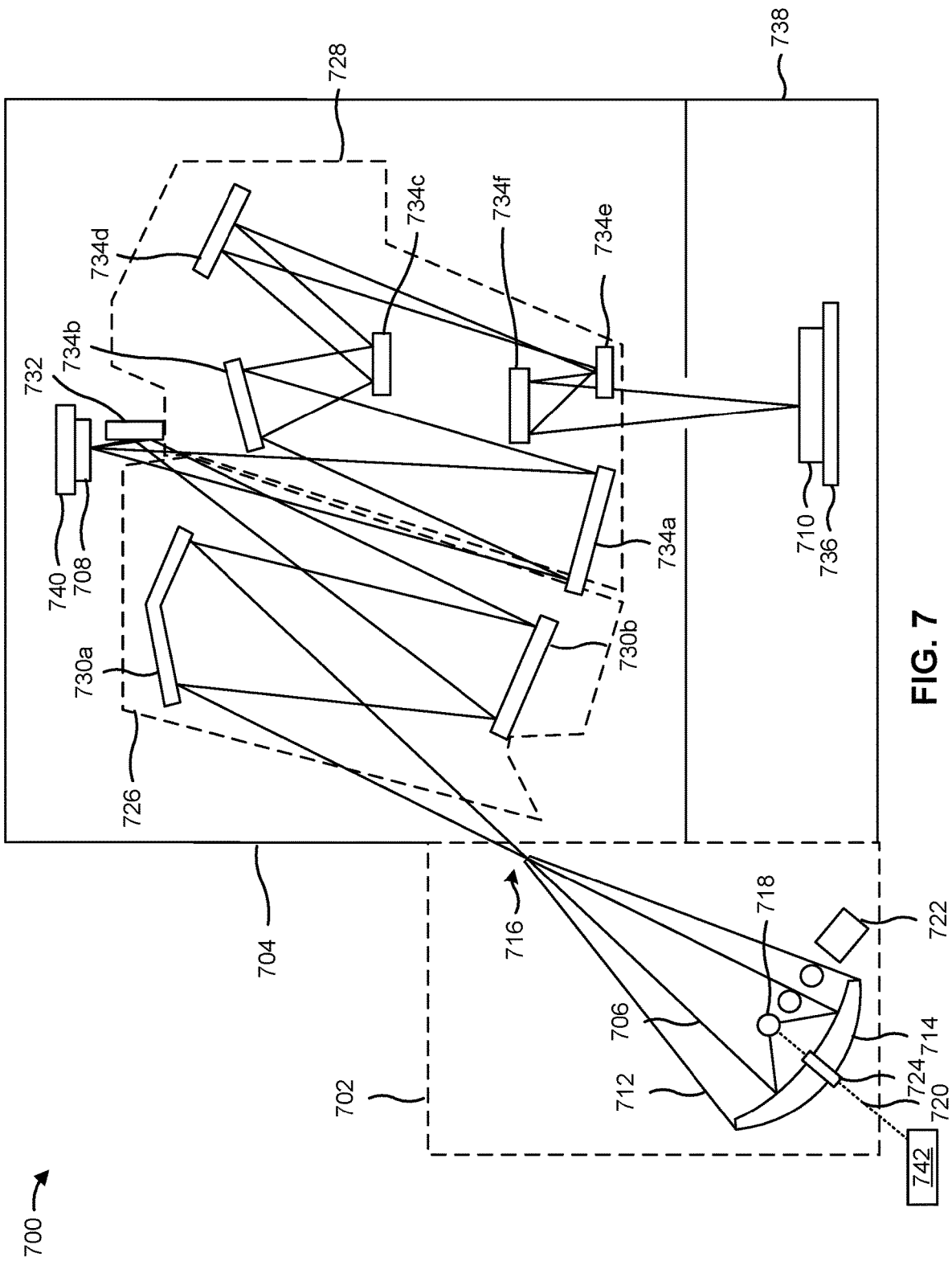
FIG. 7 is a diagram of an embodiment of a lithography system described herein.

FIG. 7 is a diagram of an embodiment of a lithography system 700 described herein. The lithography system 700 includes an extreme ultraviolet (EUV) lithography system (e.g., a EUV lithography tool 100) or another type of lithography system that is configured to transfer a pattern to a semiconductor substrate using mirror-based optics. The lithography system 700 may be configured for use in a semiconductor processing environment such as a semiconductor foundry or a semiconductor fabrication facility.

As shown in FIG. 7, the lithography system 700 includes the radiation source 702 and an exposure tool 704. The radiation source 702 (e.g., an EUV radiation source or another type of radiation source) is configured to generate radiation 706 such as EUV radiation and/or another type of electromagnetic radiation (e.g., light). The exposure tool 704 (e.g., an EUV scanner or another type of exposure tool) is configured to focus the radiation 706 onto a reflective reticle 708 (e.g., reticle 120 and/or a photomask) such that a pattern is transferred from the reticle 708 onto a semiconductor substrate 710 (e.g., wafer 224) using the radiation 706.

The radiation source 702 includes a vessel 712 and a collector 714 in the vessel 712. The collector 714, includes a curved mirror that is configured to collect the radiation 706 generated by the radiation source 702 and to focus the radiation 706 toward an intermediate focus 716. The radiation 706 is produced from a plasma that is generated from droplets 718 (e.g., tin (Sn) droplets or another type of droplets) being exposed to a laser beam 720. The droplets 718 are provided across the front of the collector 714 by a droplet generator (DG) head 722. The DG head 722 is pressurized to provide a fine and controlled output of the droplets 718.

A laser source, such as a pulse carbon dioxide ($CO_2$) laser, generates the laser beam 720. The laser beam 720 is provided (e.g., by a beam delivery system to a focus lens) such that the laser beam 720 is focused through a window 724 of the collector 714. The laser beam 720 is focused onto the droplets 718 which generates the plasma. The plasma produces a plasma emission, some of which is the radiation 706. The laser 720 is pulsed at a timing that is synchronized with the flow of the droplets 718 from the DG head 722.

The exposure tool 704 includes an illuminator 726 and a projection optics box (POB) 728. The illuminator 726 includes a plurality of reflective mirrors that are configured to focus and/or direct the radiation 706 onto the reticle 708 so as to illuminate the pattern on the reticle 708. The plurality of mirrors include, for example, a mirror 730a and a mirror 730b. The mirror 730a includes a field facet mirror (FFM) or another type of mirror that includes a plurality of field facets. The mirror 730b includes a pupil facet mirror (PFM) or another type of mirror that also includes a plurality of pupil facets. The facets of the mirrors 730a and 730b are arranged to focus, polarize, and/or otherwise tune the radiation 706 from the radiation source 702 to increase the uniformity of the radiation 706 and/or to increase particular types of radiation components (e.g., transverse electric (TE) polarized radiation, transverse magnetic (TM) polarized radiation). Another mirror 732 (e.g., a relay mirror) is included to direct radiation 706 from the illuminator 726 onto the reticle 708.

The projection optics box 728 includes a plurality of mirrors that are configured to project the radiation 706 onto the semiconductor substrate 710 after the radiation 706 is modified based on the pattern of the reticle 708. The plurality of reflective mirrors include, for example, mirrors 734a-734f. In some implementations, the mirrors 734a-734f are configured to focus or reduce the radiation 706 into an exposure field, which may include one or more die areas on the semiconductor substrate 710.

The exposure tool 704 includes a wafer stage 736 (e.g., a substrate stage) configured to support the semiconductor substrate 710. Moreover, the wafer stage 736 is configured to move (or step) the semiconductor substrate 710 through a plurality of exposure fields as the radiation 706 transfers the pattern from the reticle 708 onto the semiconductor substrate 710. The wafer stage 736 is included in a bottom module 738 of the exposure tool 704. The bottom module 738 includes a removable subsystem of the exposure tool 704. The bottom module 738 may slide out of the exposure tool 104 and/or otherwise may be removed from the exposure tool 704 to enable cleaning and inspection of the wafer stage 736 and/or the components of the wafer stage 736. The bottom module 738 isolates the wafer stage 736 from other areas in the exposure tool 704 to reduce and/or minimize contamination of the semiconductor substrate 710. Moreover, the bottom module 738 may provide physical isolation for the wafer stage 736 by reducing the transfer of vibrations (e.g., vibrations in the semiconductor processing environment in which the lithography system 700 is located, vibrations in the lithography system 700 during operation of the lithography system 700) to the wafer stage 736 and, therefore, the semiconductor substrate 110. This reduces movement and/or disturbance of the semiconductor substrate 710, which reduces the likelihood that the vibrations may cause a pattern misalignment.

The exposure tool 704 also includes a reticle stage 740 that configured to support and/or secure the reticle 708. Moreover, the reticle stage 740 is configured to move or slide the reticle through the radiation 706 such that the reticle 708 is scanned by the radiation 706. In this way, a pattern that is larger than the field or beam of the radiation 706 may be transferred to the semiconductor substrate 708.

The lithography system 700 includes a laser source 742. The laser source 742 is configured to generate the laser beam 720. The laser source 742 may include a CO2-based laser source or another type of laser source. Due to the wavelength of the laser beams generated by a CO2-based laser source in an infrared (IR) region, the laser beams may be highly absorbed by tin, which enables the CO2-based laser source to achieve high power and energy for pumping tin-based plasma. In some implementations, the laser beam 720 includes a plurality of types of laser beams that the laser source 742 generates using a multi-pulse technique (or a multi-stage pumping technique), in which the laser source 742 generates a pre-pulse laser beam and main-pulse laser beam to achieve greater heating efficiency of tin (Sn)-based plasma to increase conversion efficiency.

In an example exposure operation (e.g., an EUV exposure operation), the droplet generator 722 provides the stream of the droplets 718 across the front of the collector 714. The laser beam 720 contacts the droplets 718, which causes a plasma to be generated. The laser source 742 generates and provides a pre-pulse laser beam toward a target material droplet in the stream of the droplets 718, and the pre-pulse laser beam is absorbed by the target material droplet. This transforms the target material droplet into disc shape or a mist. Subsequently, the laser source 742 provides a main-pulse laser beam with large intensity and energy toward the disc-shaped target material or target material mist. Here, the atoms of the target material are neutralized, and ions are generated through thermal flux and shock wave. The main-pulse laser beam pumps ions to a higher charge state, which causes the ions to radiate the radiation 706 (e.g., EUV light).

The radiation 706 is collected by the collector 714 and directed out of the vessel 712 and into the exposure tool 704 toward the mirror 730a of the illuminator 726. The mirror 730a reflects the radiation 706 onto the mirror 730b, which reflects the radiation 706 onto the mirror 732 toward the reticle 708. The radiation 706 is modified by the pattern in the reticle 708. In other words, the radiation 706 reflects off of the reticle 708 based on the pattern of the reticle 708. The reflective reticle 708 directs the radiation 706 toward the mirror 734a in the projection optics box 728, which reflects the radiation 706 onto the mirror 734b. The radiation 706 continues to be reflected and reduced in the projection optics box 728 by the mirrors 734c-734f. The mirror 734f reflects the radiation 706 onto the semiconductor substrate 710 such that the pattern of the reticle 708 is transferred to the semiconductor substrate 710. The above-described exposure operation is an example, and the lithography system 700 may operate according to other EUV techniques and radiation paths that include a greater quantity of mirrors, a lesser quantity of mirrors, and/or a different configuration of mirrors.

As indicated above, FIG. 7 is provided as an example. Other examples may differ from what is described with regard to FIG. 7.

Based on having the particle removed from the backside surface of the reticle without damaging the backside surface of the reticle, the reticle may couple to an electrostatic chuck without deformity caused by a non-planar interface between the reticle and the electrostatic chuck. In this way, the reticle has a decreased likelihood of distorting an intended shape of light received at the reticle for projection to a semiconductor device (e.g., a substrate). The decreased likelihood of distorting the intended shape of the light may improve precision of etching of the semiconductor device, which may reduce a likelihood of portions of the semiconductor device failing and/or the entire semiconductor device failing. This may conserve resources and reduce manufacturing times to produce a number of functioning semiconductor devices.

As described in greater detail above, some implementations described herein provide a reticle cleaning device. The reticle cleaning device includes a support member configured for extension toward a reticle within an EUV lithography tool. The reticle cleaning device also includes a contact surface disposed at an end of the support member and configured to bond to particles contacted by the contact surface. The reticle cleaning device further includes a stress sensor configured to measure an amount of stress applied to the support member at the contact surface.

As described in greater detail above, some implementations described herein provide a method. The method includes performing a movement operation on a support member of a reticle cleaning device to move a contact surface of the support member toward a reticle within an EUV lithography tool. The method also includes detecting amounts of stress applied to the support member during the movement operation. The method further includes ceasing movement of the contact surface of the support member toward the reticle based on detecting an amount of stress applied to the support member that satisfies a threshold.

As described in greater detail above, some implementations described herein provide a method. The method includes obtaining location information associated with a particle disposed on a backside surface of a reticle of an EUV lithography tool. The method also includes initiating movement of a support member of a reticle cleaning device to move a contact surface of the support member toward the backside surface of the reticle. The method further includes receiving, via a stress sensor, an indication of an amount of stress applied to the support member during the movement of the support member. The method additionally includes ceasing the movement of the support member toward the reticle within the EUV lithography tool based on the amount of stress applied to the support member satisfying a threshold.

As described in greater detail above, some implementations described herein provide a method. The method includes receiving a wafer having a photoresist disposed on a surface. The method also includes performing a movement operation on a support member of a reticle cleaning device to move a contact surface of the support member toward a reticle within an extreme ultraviolet lithography tool. The method further includes detecting amounts of stress applied to the support member during the movement operation. The method additionally includes ceasing movement of the contact surface of the support member toward the reticle based on detecting an amount of stress applied to the support member that satisfies a threshold. The method also includes projecting EUV radiation onto the reticle. The method further includes reflecting the EUV radiation toward the wafer to expose the photoresist to the EUV radiation.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
determining a threshold amount of stress to be applied to a support member of a reticle cleaning device, based on at least one of: a material of a reticle within an extreme ultraviolet lithography tool, or a material of a particle on the reticle;
performing a movement operation on the support member to move a contact surface of the support member toward the reticle; and
ceasing movement of the contact surface of the support member toward the reticle based on satisfying the threshold amount of stress.

2. The method of claim 1, wherein performing the movement operation is based on receiving an indication that the particle is on the reticle.

3. The method of claim 2, wherein the indication that the particle is on the reticle comprises one or more of:
an indication of a location of the particle on the reticle,
an indication of a size of the particle, or
an indication of a height of the particle.

4. The method of claim 1, wherein the threshold amount is further based on one or more of:
a location of the particle on of the reticle,
a size of the particle, or
a height of the particle.

5. The method of claim 1, wherein performing the movement operation comprises at least one of:
moving the contact surface of the support member to a position above the particle on the reticle, or
initiating lowering of the contact surface to a height that is based on a height of the particle.

6. The method of claim 5, further comprising:
rotating the support member after ceasing the movement of the contact surface of the support member toward the reticle.

7. A method comprising:
signaling an initiation of a movement operation on a support member of a reticle cleaning device to move a contact surface of the support member toward a reticle within an extreme ultraviolet lithography tool; and
signaling a threshold amount of stress to be applied to the support member for ceasing movement of the contact surface of the support member toward the reticle, wherein the threshold amount of stress is based on at least one of: a material of the reticle, or a material of a particle on the reticle.

8. The method of claim 7, further comprising:
determining one or more controls for the movement operation,
wherein the initiation of the movement operation comprises the one or more controls for the movement operation.

9. The method of claim 8, wherein the one or more controls include at least one of:
a height to which the contact surface is to be moved to contact the particle on the reticle, or
a position to where the contact surface is above the particle.

10. The method of claim 7, further comprising:
determining the threshold amount of stress applied to the support member,
wherein signaling the threshold amount of stress is based on determining the threshold amount of stress.

11. The method of claim 7, further comprising:
receiving an indication that the particle is on a surface of the reticle,
wherein signaling the initiation is based on receiving the indication.

12. The method of claim 7, further comprising:
receiving an indication of one or more characteristics of the particle on the reticle,
wherein the movement operation is based on the one or more characteristics of the particle.

13. A reticle cleaning device, comprising:
one or more memories; and
one or more processors, coupled to the one or more memories, configured to:
signal an initiation of a movement operation on a support member of a reticle cleaning device to move a contact surface of the support member toward a reticle within an extreme ultraviolet lithography tool; and
signal a threshold amount of stress to be applied to the support member for ceasing movement of the contact surface of the support member toward the reticle,
wherein the threshold amount of stress is based on: at least one of a material of the reticle, or a material of a particle on the reticle.

14. The reticle cleaning device of claim 13, wherein the one or more processors are further configured to:
determine one or more controls for the movement operation,
wherein the initiation of the movement operation comprises the one or more controls for the movement operation.

15. The reticle cleaning device of claim 14, wherein the one or more controls include at least one of:
a height to which the contact surface is to be moved to contact the particle on the reticle, or
a position to where the contact surface is above the particle.

16. The reticle cleaning device of claim 13, wherein the one or more processors are further configured to:
determine the threshold amount of stress to be applied to the support member,
wherein signaling the threshold amount of stress is based on determining the threshold amount of stress.

17. The reticle cleaning device of claim 13, wherein the one or more processors are further configured to:
receive an indication that a particle is on a surface of the reticle,
wherein signaling the initiation is signaled based on receiving the indication.

18. The reticle cleaning device of claim 13, wherein the one or more processors are further configured to:
receive an indication of one or more characteristics of a particle on a surface of the reticle,
wherein the movement operation is based on the one or more characteristics of the particle.

19. The reticle cleaning device of claim 13, wherein the one or more processors are further configured to:

receive an indication that the threshold amount of stress has been applied to the support member.

\* \* \* \* \*